United States Patent
Kim et al.

(10) Patent No.: US 9,508,663 B2
(45) Date of Patent: Nov. 29, 2016

(54) ASSEMBLY AND PACKAGING OF MEMS DEVICE

(71) Applicant: Invensense, Inc., Sunnyvale, CA (US)

(72) Inventors: Brian H. Kim, Fremont, CA (US); Haijun She, San Jose, CA (US); Mozafar Maghsoudnia, San Jose, CA (US)

(73) Assignee: INVENSENSE, INC., San Jose, CA (US)

( * ) Notice: Subject to any disclaimer, the term of this patent is extended or adjusted under 35 U.S.C. 154(b) by 158 days.

(21) Appl. No.: 13/950,178

(22) Filed: Jul. 24, 2013

(65) Prior Publication Data

US 2015/0028432 A1    Jan. 29, 2015

(51) Int. Cl.
*H01L 23/00*   (2006.01)
*B81C 1/00*   (2006.01)
*B81B 3/00*   (2006.01)
*B81B 7/00*   (2006.01)

(52) U.S. Cl.
CPC ............... *H01L 24/06* (2013.01); *B81B 3/001* (2013.01); *B81B 7/0032* (2013.01); *B81C 1/00238* (2013.01); *B81C 1/00261* (2013.01); *H01L 24/04* (2013.01); *H01L 24/75* (2013.01); *B81B 2207/012* (2013.01); *B81B 2207/093* (2013.01); *B81C 2203/019* (2013.01)

(58) Field of Classification Search
CPC ............. H01L 23/49513; H01L 24/05; H01L 2224/4846; H01L 24/06; H01L 24/09; H01L 24/04; B81B 3/001; B81C 2203/019; B81C 1/00238
See application file for complete search history.

(56) References Cited

U.S. PATENT DOCUMENTS

| | | | |
|---|---|---|---|
| 6,522,015 B1 * | 2/2003 | Glenn ................... | B81B 7/0077 257/666 |
| 8,669,137 B2 * | 3/2014 | Nah et al. ..................... | 438/108 |
| 2004/0092055 A1 * | 5/2004 | Liu ..................... | H01L 31/0203 438/65 |
| 2006/0097331 A1 | 5/2006 | Hattori et al. | |
| 2008/0063232 A1 * | 3/2008 | Song .............................. | 381/355 |
| 2010/0290199 A1 | 11/2010 | Schmid et al. | |
| 2011/0147859 A1 * | 6/2011 | Tanaka et al. ................. | 257/415 |
| 2011/0258683 A1 * | 10/2011 | Cicchitto .......................... | 726/4 |
| 2012/0091578 A1 * | 4/2012 | Chen ....................... | H01L 24/03 257/737 |
| 2012/0101540 A1 * | 4/2012 | O'Brien ............... | A61B 5/0031 607/9 |
| 2012/0126347 A1 * | 5/2012 | Yang .................... | B81B 7/0064 257/416 |
| 2012/0139090 A1 * | 6/2012 | Kim ....................... | H01L 25/16 257/659 |
| 2012/0142144 A1 * | 6/2012 | Taheri ..................... | B81B 7/007 438/107 |
| 2012/0223433 A1 * | 9/2012 | Jee .......................... | H01L 24/16 257/772 |
| 2012/0252168 A1 * | 10/2012 | Nah ...................... | H01L 21/563 438/124 |

(Continued)

FOREIGN PATENT DOCUMENTS

WO    WO2012037537    3/2012

*Primary Examiner* — Joseph C Nicely
(74) *Attorney, Agent, or Firm* — Maryam Imam; IPxLAW Group LLP

(57) ABSTRACT

A Micro Electro Mechanical systems (MEMS) device includes a solder bump on a substrate, a CMOS-MEMS die comprising a CMOS die and a MEMS die, and stud bumps on the CMOS die. The MEMS die is disposed between the CMOS die and the substrate. The stud bumps and the solder bumps are positioned to provide an electrical connection between the CMOS die and the substrate.

20 Claims, 7 Drawing Sheets

(56) References Cited

U.S. PATENT DOCUMENTS

| | | | |
|---|---|---|---|
| 2013/0049190 A1* | 2/2013 | Topacio | H01L 24/05 257/737 |
| 2013/0093031 A1* | 4/2013 | Gao | H01L 29/66007 257/417 |
| 2013/0168740 A1* | 7/2013 | Chen | B81C 1/00238 257/254 |
| 2013/0214368 A1* | 8/2013 | Fonk | B81C 1/00238 257/417 |
| 2013/0214890 A1* | 8/2013 | Zabaco | H01F 17/0013 336/200 |
| 2013/0270660 A1* | 10/2013 | Bryzek | H01L 29/84 257/418 |
| 2013/0285166 A1* | 10/2013 | Classen | B81C 1/00134 257/415 |
| 2013/0299928 A1* | 11/2013 | Classen | B81B 3/0075 257/417 |
| 2013/0320569 A1* | 12/2013 | Aoki | H01L 23/562 257/777 |
| 2013/0328204 A1* | 12/2013 | Zommer | 257/765 |
| 2013/0334621 A1* | 12/2013 | Classen | B81B 3/0018 257/415 |
| 2013/0334626 A1* | 12/2013 | Weber | B81B 3/0018 257/416 |
| 2014/0237815 A1* | 8/2014 | Lau | H01L 21/68 29/834 |
| 2014/0281693 A1* | 9/2014 | Jeddeloh | G06F 11/2017 714/6.32 |
| 2014/0332713 A1* | 11/2014 | Mizutani et al. | 252/79.3 |
| 2014/0339710 A1* | 11/2014 | Fujiwara et al. | 257/783 |
| 2014/0374856 A1* | 12/2014 | Chen | B81B 3/0005 257/418 |
| 2015/0115440 A1* | 4/2015 | Higuchi | H01L 24/05 257/737 |
| 2015/0137806 A1* | 5/2015 | Wan et al. | 324/252 |
| 2015/0140376 A1* | 5/2015 | Shaffer, II et al. | 429/72 |
| 2015/0140782 A1* | 5/2015 | Stuber et al. | 438/458 |

\* cited by examiner

ASSEMBLY AND PACKAGING OF MEMS DEVICE

BACKGROUND

Various embodiment of the invention relate generally to a Micro Electro Mechanical Systems (MEMS) device and particularly to the assembly and packaging thereof.

MEMS devices are typically utilized in conjunction with a complimentary metal-oxide semiconductor (CMOS). Currently, the CMOS die is formed on top of a substrate and the MEMS die is formed on top of the CMOS die. Wire bonding is generally used to electrically connect the CMOS die with the substrate through a wire generally made of gold (Au). This wire has a thickness on the order of 25 micro meters and has to be protected by encapsulation by a polymer. Additionally, the top surface of the MEMS die is protected by formation of a molding compound. Wire bonding undesirably leads to increased size of the MEMS device in addition to being a source of damaging of the MEMS device.

The dimension of the MEMS device from the substrate to the polymer that is formed on top of the MEMS die, commonly referred to as a "profile", is most desirably as low as possible. However, reduction of this dimension is currently limited due to wire bonding as well as the polymer formed on top of the MEMS die. In effect, wire bonding prevents reduction of the profile.

Accordingly, it is desirable to reliably assemble and package a MEMS device with a reduced profile.

SUMMARY

Briefly, a Micro Electro Mechanical Systems (MEMS) includes a substrate, a CMOS-MEMS die, at least one solder bump on the substrate, and at least one stud bump on the CMOS die. The CMOS-MEMS die includes a CMOS die and a MEMS die vertically stacked, attached, and electrically connected. The at least one stud bump and the at least one solder bump being positioned between the substrate and the CMOS die to define a height between the CMOS die and the substrate and hence the MEMS device, wherein the at least one stud bump and the at least one solder bump causes an electrical connection between the CMOS die and the substrate.

A further understanding of the nature and the advantages of particular embodiments disclosed herein may be realized by reference of the remaining portions of the specification and the attached drawings.

DETAILED DESCRIPTION OF EMBODIMENTS

The following description describes a Micro Electro Mechanical systems (MEMS) device and a method of manufacturing the same. The MEMS device includes a MEMS layer formed on top of a substrate and onto which a CMOS layer is formed. The MEMS layer and the CMOS layer are vertically stacked, attached and electrically connected. The CMOS die is electrically connected to the substrate through stud bumps and solder bumps. The MEMS die may include MEMS sensors such as, but not limited to accelerometer, gyroscope, magnetometer, microphone, and pressure sensor.

In another embodiment of the invention, an air gap physically separates the MEMS die from the substrate.

Particular embodiments and methods of the invention disclose a MEMS device and methods of manufacturing the same. The MEMS device has a substrate, a CMOS-MEMS die, at least one solder bump and, at least one stud bump. The at least one stud bump and the at least one solder bump are positioned between the substrate and the CMOS die and defines a height there between. The at least one stud bump and the at least one solder bump causes an electrical connection between the CMOS die and the substrate. In the described embodiments, the substrate is a semiconductor substrate, LGA substrate or any other similar substrates.

In an embodiment of the invention, the at least one stud bump is formed on a CMOS die of a CMOS-MEMS die and connected to the CMOS die using wet soldering.

Figure 1:
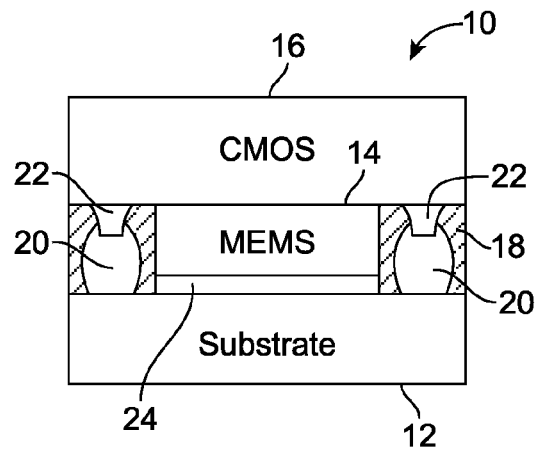
FIG. 1 shows a MEMS device 10, in accordance with an embodiment of the invention.

Referring now to FIG. 1, a MEMS device 10 is shown in accordance with an embodiment of the invention. The MEMS device 10 is shown to include substrate 12, MEMS 14, CMOS 16, stud bumps 22, solder bumps 20, polymer 18, and air gap 24. The CMOS-MEMS die is initially a part of a CMOS-MEMS wafer. The substrate 12 is a portion of a larger substrate that is separate and distinct from the CMOS-MEMS die. In some embodiments, MEMS 14 may include one or more MEMS layers. In some embodiments, CMOS 16 may include one or more CMOS layers. Other embodiments may include alternate layers of CMOS 16 and MEMS 14.

The substrate 12 is electrically connected to CMOS 16 through stud bumps 22. The stud bumps 22 are connected to the substrate 12 through solder bumps 20. The solder bumps 20, shown formed on the substrate 12 are positioned on at least one side of the MEMS 14. It is understood that while one or two MEMS devices are shown in the figures presented, typically, a greater number of MEMS devices are grown on a wafer. The stud bumps 22 are formed on a surface of CMOS 16 to make contact with solder bumps 20. The substrate 12 is typically a printed circuit board (PCB).

The polymer 18 is shown surrounding the stud bumps 22 and solder bumps 20 and between the substrate 12 and the CMOS 16, on at least one side of the MEMS 14, but not in the air gap 24. The expansion coefficient of the MEMS 14 and the substrate 12 are different with this difference typically causing stress on the MEMS 14. The air gap 24 advantageously serves to decouple the contact between the MEMS 14 and the substrate 12 thereby reducing the effect of the difference of the coefficient of expansion between the MEMS 14 and the substrate 12. This leads to reducing stress on the MEMS 14.

The air gap 24 is formed by using a material for the polymer 18 that does not travel into the area between the MEMS 14 and the substrate 12. Also, because the air gap 24 is a very small gap, when the polymer 18 is deposited, it does not get into the air gap area. Upon depositing the polymer, it is cured by heating, as is further discussed below relative to subsequent figures and discussions.

In exemplary embodiments of the invention, the polymer 18 is made of epoxy, silicone, or underfill material.

In the embodiment of FIG. 1, the solder bumps 20 are physically connected to the stud bumps 22 to provide electrical conducting path from CMOS 14 to substrate 12.

As shown in FIG. 1, the solder bumps 20 and the stud bumps 22 collectively define a height between the substrate 12 and the CMOS 16. Without the presence of wire bonding, as shown in FIG. 1, the profile of the MEMS device 10 and that of other embodiments of the invention is reduced. In some embodiments, this reduction is approximately 25% relative to prior art profiles.

Figure 2:
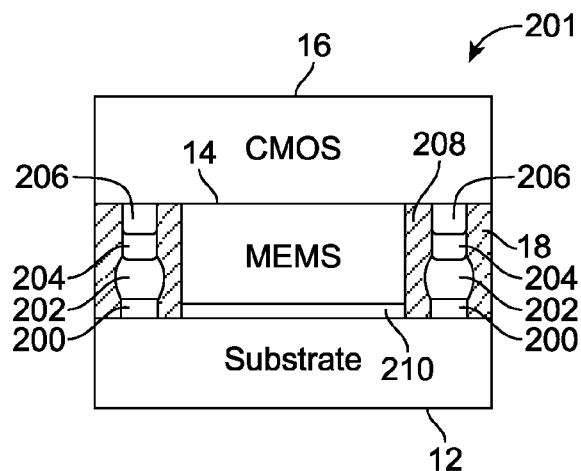
FIG. 2 shows a MEMS device 201, in accordance with another embodiment of the invention.

The top surface of the CMOS 16 or the surface thereof that is opposite to the surface onto which the MEMS 14 is positioned, is exposed. This also helps to reduce the profile of the device 10. FIG. 2 shows a MEMS device 201, in accordance with another embodiment of the invention. The device 201 is analogous to the device 10 except that the CMOS 16 and the substrate 12 are shown separated from each other by a height defined by two stud bumps 206 and 204 and solder bumps 202 and copper bump 200 instead of the stud bumps 22 and the solder bumps 20 of FIG. 1. In FIG. 2, the air gap 210, similar to the air gap 24 of FIG. 1, is shown to separate the MEMS 14 from the substrate 12. In other embodiments, more than two stud bumps can be stacked on two or more solder bumps to provide required clearance between substrate 12 and CMOS 16. In FIG. 2, the copper bump 200 is shown formed on the substrate 12 on top of which is shown formed the solder bumps 202. The stud bumps 206 are shown formed on the CMOS 14 and on top of the stud bumps 206 are shown formed stud bumps 204, which are shown to be in physical contact with the solder bumps 204.

In an embodiment of the invention, the solder bumps 20, and 202 are made of Eutectic solder (or PbSn). In another embodiment of the invention, solder bump 20, and 202 are made of SAC 305, which is approximately 96.5% tin, 3% silver, and 0.5% copper. In yet another embodiment, the solder bumps 20,202 are made of SAC 405, which is approximately 95.5% tin, 4% silver, and 0.5% copper. In yet another embodiment of the invention, they are made of tin or any other suitable material. In some embodiments, solder bumps 20 may be made of copper.

As with the stud bumps 22 of the embodiment of FIG. 1, and the stud bumps 204 and 206 are made of gold, in accordance with an exemplary embodiment of the invention. In another embodiment, the stud bumps 20, 204 and 206 are made of copper. In another embodiment, the stud bumps 20, 204 and 206 can be made by standard ball wire bonding machine.

Figure 3:
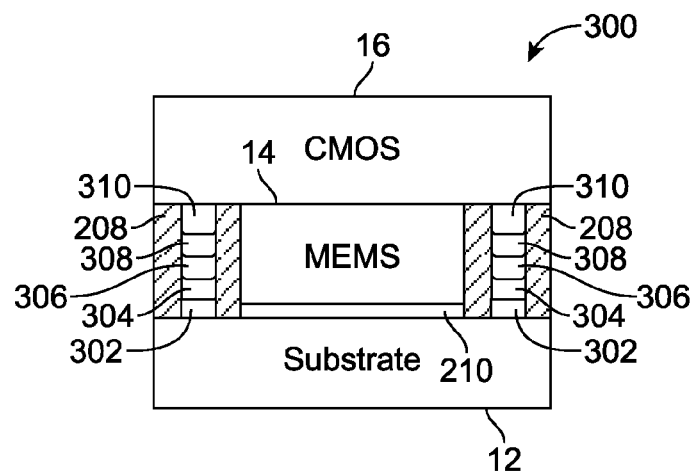
FIG. 3 shows a MEMS device 300, in accordance with yet another embodiment of the invention.

FIG. 3 shows a MEMS device 300, in accordance with yet another embodiment of the invention. The device 300 is analogous to the device 201 except that the CMOS 16 and the substrate 12 are shown separated from each other by a height defined by a stack of stud bumps 304-310, and the solder bumps 302. The stud bumps 304-310 are each made of gold, in exemplary embodiments of the invention. The solder bumps 302 are made of the same material as that of the solder bumps 202.

While, in the embodiment of FIG. 3, four stud bumps are shown to form the stack of stud bumps, it is understood that any suitable number of stud bumps may be employed. It is also understood that the stud bumps 304-310 in addition to the solder bumps 302 help to determine the profile of the device 300.

The MEMS device of the various embodiments of the invention exhibits increased reliability as it is better protected from mechanical shock, among other types of damage, by being sandwiched between the substrate and the CMOS. Furthermore, the MEMS device avoids the use of wire bonding to connect the CMOS to the substrate and in this respect realizes a reduced profile.

Figure 4:
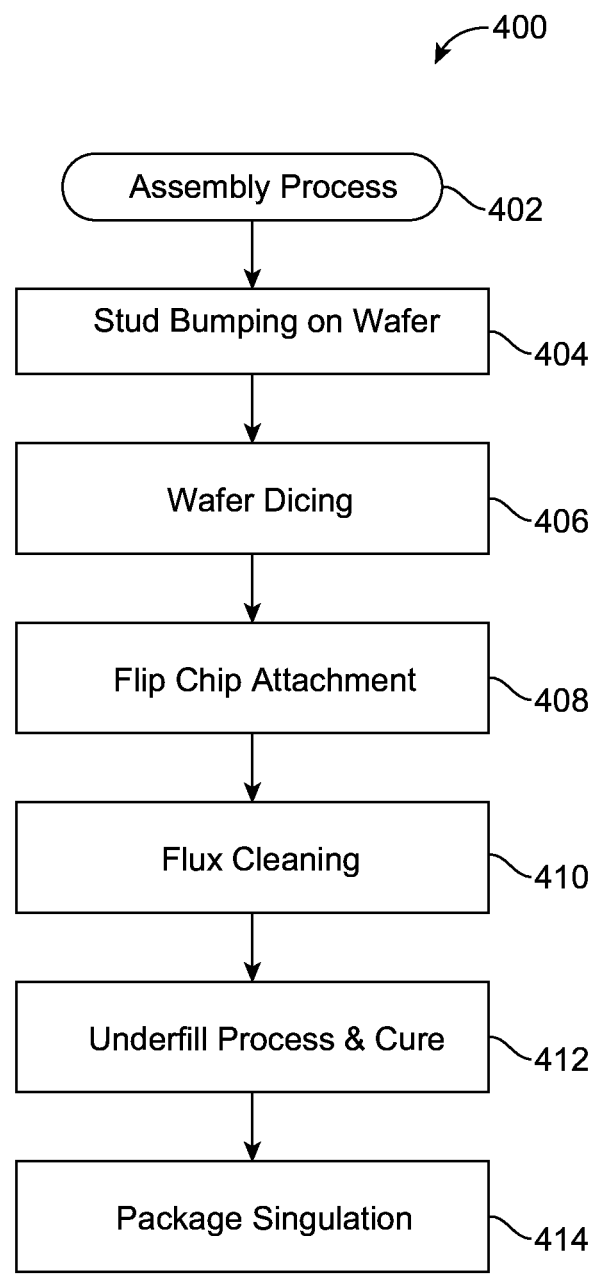
FIG. 4 shows a flow chart 400 outlining the steps required to assemble the MEMS device in accordance with a method of the invention.

FIG. 4 shows a flow chart 400 outlining the steps required to assemble the MEMS device in accordance with a method of the invention. At 402, the assembly process begins followed by the step 404 of placing stud bumps on a CMOS-MEMS wafer. Next, at step 406, the CMOS-MEMS wafer is diced or cut into a number of die. Subsequently, at step 408, the die is flipped such that the MEMS die is positioned on top of a substrate with solder bumps and the CMOS die is positioned on top of the MEMS die. In an embodiment, this step is optional. During flip chip attachment 408, soldering is performed with the flux being in liquid form to be followed by hardening at which time the physical connection between the stud bumps and solder bumps is solidified. Next, at step 410, flux cleaning is performed and at step 412, underfilling is done and the device is cured (heated). Lastly, at step 414, the package is singulated.

Figure 5:
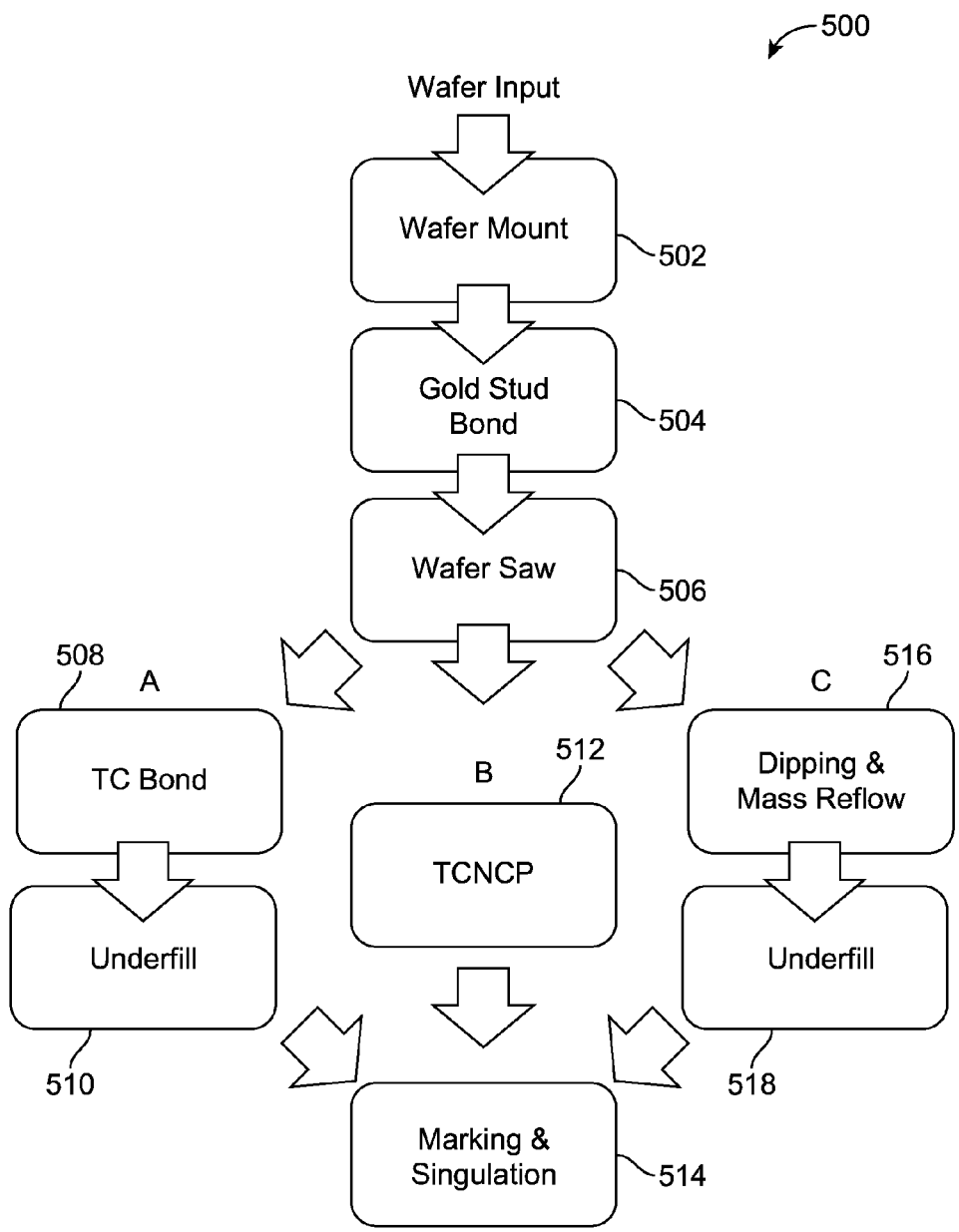
FIG. 5 shows a flow chart 500 of three methods of manufacturing (or assembling) the MEMS device of the various embodiments of the invention.

FIG. 5 shows a flow chart 500 of three methods of manufacturing (or assembling) the MEMS device of the various embodiments of the invention. At step 502, a CMOS-MEMS wafer is input into the machine and mounted. The CMOS-MEMS comprises a MEMS wafer vertically stacked on a CMOS wafer and attached. Next, at step 504, stud bumps are bonded onto the CMOS portion of the CMOS-MEMS wafer. As previously noted, in an embodiment of the invention, the stud bumps are made of gold (Au). Next, at step 506, the CMOS-MEMS wafer with the stud bumps is diced or cut into various die. From hereon, any of the three series of steps or methods may be employed, with each method marked by A, B, or C in FIG. 5.

In method A, after the step 506, the CMOS-MEM die is flipped such that the MEMS die is positioned under the CMOS die and thermal compression bonding is performed at step 508. In another embodiment, flipping is optional. As known in the industry, this is done by raising the temperature of the CMOS-MEMS die by placing a heating block on bottom surface of the substrate and heating the from top using a pickup tool and thereof to cause bonding of the stud bumps with the solder bumps of the substrate. Lastly, at step 510, the polymer 18 or 208 is dispersed to fill the gap around the stud bumps and solder bumps between the CMOS die and the substrate but not under the MEMS and the substrate, or air gap. The last step of method A, step 514 includes curing, marking the die and singulating the substrate.

In accordance with another method, i.e. B in FIG. 5, after the step 506, the step 512 is performed where the CMOS-MEMS die is flipped such that the CMOS die is on top of the MEMS die. In another embodiment, flipping is optional. Step 512 also includes thermal compression with non-conductive paste (TCNCP) is performed. In this step, the non-conductive paste is dispensed on the solder bumps over the substrate first and the CMOS-MEMS die is placed on the substrate such that the stud bumps align over the non-conductive paste coated solder bumps. Thermal compression is performed by providing heat from the top and bottom. In the described embodiments, the non-conductive paste may be an epoxy. Subsequently, upon the stud bumps making physical connection with the solder bumps, the NCP is squeezed out. This step is followed by the steps of curing, marking, and singulating as discussed in step 514 hereinabove relative to method A. However, unlike method A, no underfilling or filling with epoxy (polymer) is performed in method B.

In accordance with yet another method, i.e. C in FIG. 5, after step 506, step 516 is performed where the CMOS-MEMS die is flipped such that the CMOS die is on top of the MEMS die and dipping and mass reflowing is performed. In another embodiment, flipping is optional. During step 516, the stud bumps are dipped in flux and then placed or aligned with the solder bumps. Alternatively, flux is dispensed onto solder bumps on the substrate rather than on the CMOS-MEMS substrate such that the solder bumps are encapsulated with flux and then CMOS-MEMS die is placed over the substrate. After the placing, reflowing is performed and the die is placed into an oven and heated to make a physical connection between the stud bumps and the solder bumps. Lastly, underfilling is performed at step 518 much in the same manner underfilling is performed at step 510.

Figure 6A:
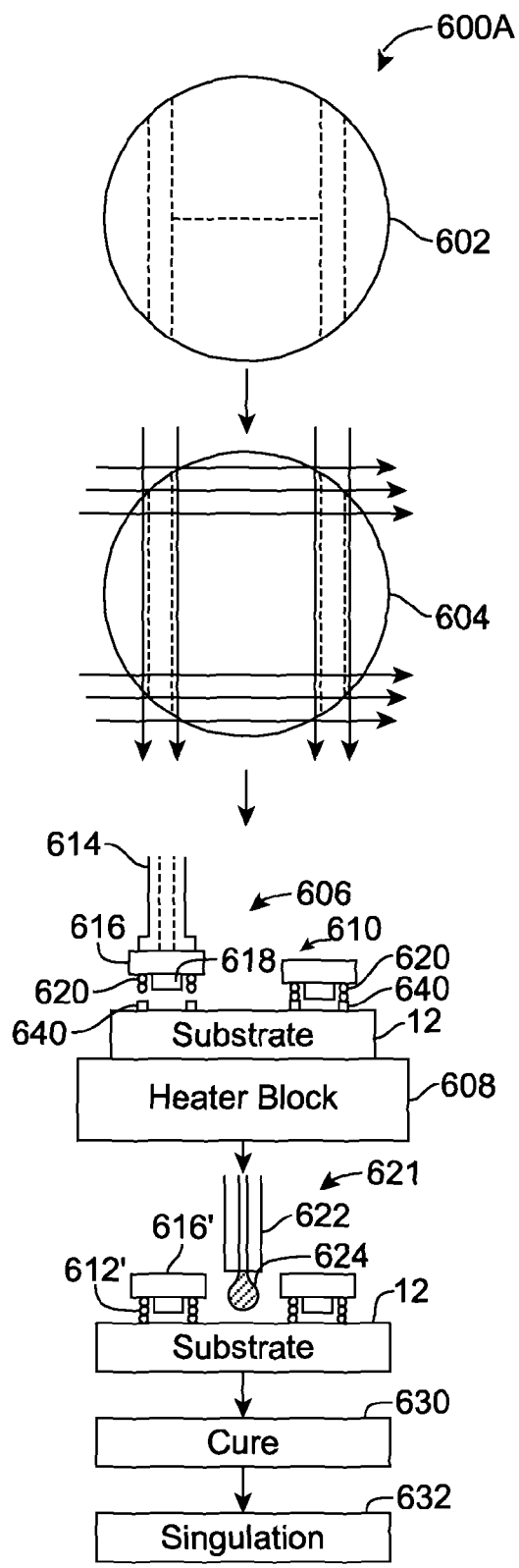
FIGS. 6A-6C each show a general appearance of the MEMS device, as it is assembled and packaged, in accordance with the methods A-C of FIG. 5.
Figure 6B:
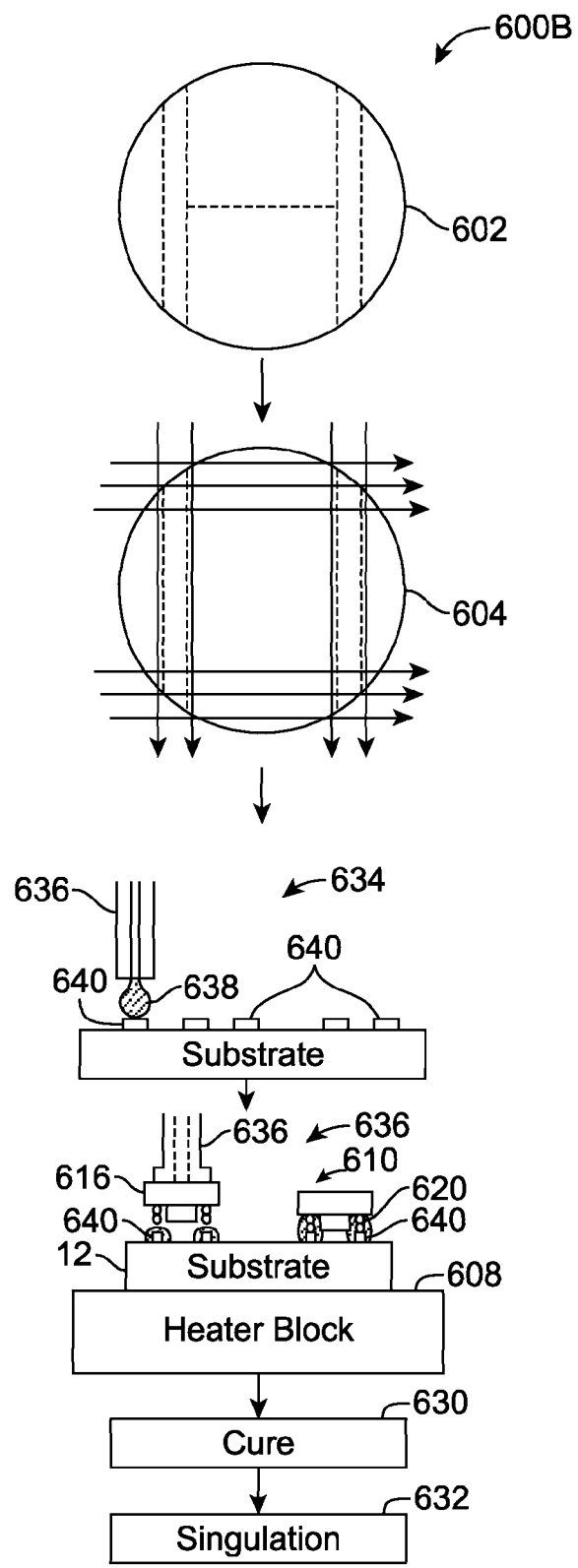
Figure 6C:
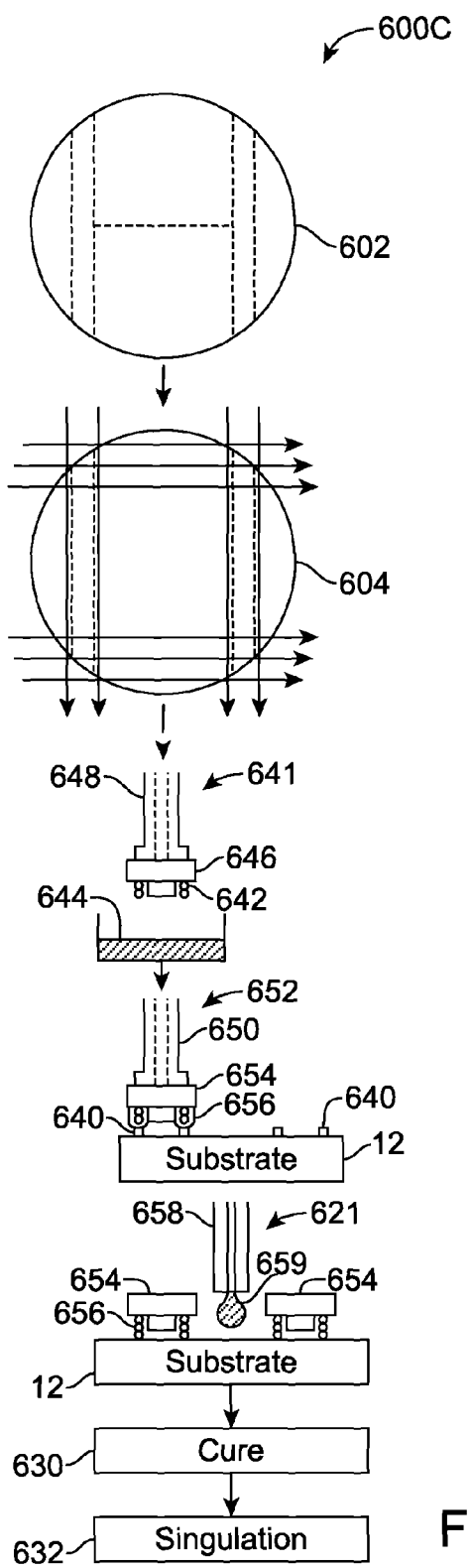

FIGS. 6A-6C each show a general appearance of the MEMS device, as it is assembled and packaged, in accordance with the methods A-C of FIG. 5.

In FIG. 6A, after the CMOS-MEMS wafer is input and mounted at 602, the step 604 shows the CMOS-MEMS water diced. Step 604 includes bonding stud bump 620 on the CMOS wafer before dicing. At 606, the CMOS-MEMS die 610 is shown having CMOS 610 situated on top of the MEMS 618. The substrate 12 is heated from the bottom thereof using the heater block 608 and from the top via pickup tool 614.

As shown at 606, the stud bumps 620 make physical contact with the solder bumps 640 of the substrate 12 after which the pickup tool 614 is removed. Next, at 621, after the stub bumps and the solder bumps are connected, underfilling is performed by dispersing polymer 624 in between and around the MEMS but not under the MEMS. At 630, the MEMS device is cured, marked and singulated in 632.

In FIG. 6B, similarly, the steps 602 and 604, at 634 are performed. Thereafter, at 634, the substrate 12 is shown to include solder bumps 640 and on top of which epoxy 638 is dispensed. Next, as shown at 636, the CMOS-MEMS die, with its stud bumps 620, is shown to make contact with the solder bumps of the substrate 12, while the substrate 12 is heated from the top via pickup tool 636 and from the bottom by placing on heater block 608, and in the process epoxy 638 is squeezed out. The steps 630 of curing and marking and 632 of singulating follow.

In FIG. 6C, the steps 602 and 604 are performed. Thereafter, at 641 the stud bumps 642 are shown to be dipped into the flux 644 using tool 648 thereby pushing the CMOS-MEMS die 646 down toward and into the flux 644. Alternately, flux can be sprayed on the solder bumps 640 on substrate 12. Next, at 652, the stud bumps are placed, or aligned with the solder bumps 640 of the substrate 12. After the placing, reflowing is performed and the die is placed into an oven and heated to make a physical connection between the stud bumps and the solder bumps. Next, at 621, polymer 659 is dispensed using dispenser 658 around and in between the MEMS but avoiding under the MEMS. At steps 630 and 632, the CMOS-MEMS die is cured, marked, and singulated, respectively.

Figure 7:
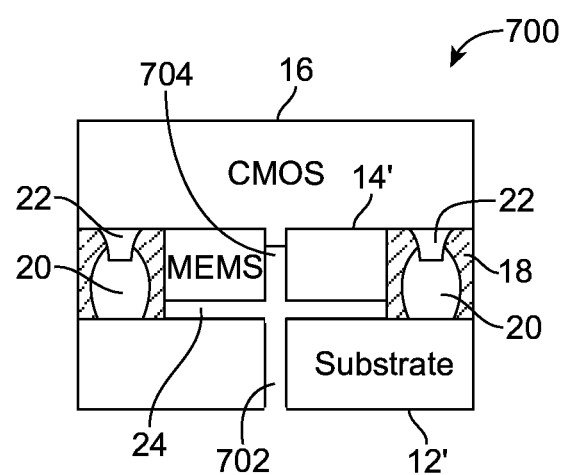
FIG. 7 shows a MEMS device 700, in accordance with another embodiment of the invention.

FIG. 7 shows a MEMS device 700, in accordance with another embodiment of the invention. The MEMS device 700 is generally used in application where the MEMS device requires exposure to the environment such as microphone, humidity sensor, pressure sensor. In microphone applications and as such, it is acoustically sealed all around, using for example a polymer or silicone epoxy, to avoid undesirable noise. Furthermore, the substrate 12' is shown to have an opening at 702 to provide access to the environment and MEMS 14' is shown to have a port 704.

Although the description has been described with respect to particular embodiments thereof, these particular embodiments are merely illustrative, and not restrictive.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

What we claim is:

1. A microelectromechanical systems (MEMS) device comprising:
   a semiconductor substrate;
   a plurality of solder bumps formed on a surface of the semiconductor substrate;
   a CMOS-MEMS die including a CMOS die and a MEMS die vertically stacked and attached to one another, wherein the MEMS die is disposed between the semiconductor substrate and the CMOS die; and
   a plurality of stud bumps formed on the CMOS die,
   wherein the plurality of stud bumps and the plurality of solder bumps being positioned between the semiconductor substrate and the CMOS die and an upper-most surface of the semiconductor substrate is positioned below a lower-most surface of the CMOS die and a lower-most surface of the MEMS die to define a height between the CMOS die and the semiconductor substrate,
   further wherein the plurality of stud bumps and the plurality of solder bumps are in direct contact.

2. The MEMS device, as recited in claim 1, further including an air gap disposed between the MEMS die and the semiconductor substrate.

3. The MEMS device, as recited in claim 1, further including one or more additional solder bumps between the plurality of solder bumps and the CMOS die.

4. The MEMS device, as recited in claim 1, further including one or more additional stud bumps between the plurality of stud bumps and the semiconductor substrate.

5. The MEMS device, as recited in claim 1, wherein the semiconductor substrate is void for port openings.

6. The MEMS device, as recited in claim 1, wherein the plurality of stud bumps is made from one of gold, copper and palladium.

7. The MEMS device, as recited in claim 1, wherein the plurality of solder bumps is made from one of: eutectic solder, tin, SAC305 and SAC405, wherein SAC305 comprises 96.5% tin, 3% silver, and 0.5% copper and SAC405 comprises 95.5% tin, 4% silver, and 0.5% copper.

8. The MEMS device, as recited in claim 1, further including an underfill formed between the CMOS die and the semiconductor substrate.

9. The MEMS device, as recited in claim 8, wherein a space disposed between the MEMS die and the semiconductor substrate is void of the underfill.

10. The MEMS device, as recited in claim 1, wherein the stud bumps are positioned on at least one side of the MEMS die and separated from the MEMS die by a polymer.

11. A microelectromechanical systems (MEMS) device comprising:
   a printed circuit board (PCB);
   a plurality of solder bumps formed on a surface of the PCB;
   a CMOS-MEMS die including a CMOS die and a MEMS die vertically stacked and attached to one another, wherein the MEMS die is disposed between the PCB and the CMOS die; and
   a plurality of stud bumps formed on the CMOS die, wherein the plurality of stud bumps and the plurality of solder bumps being positioned between the PCB and the CMOS die and an upper-most surface of the semiconductor substrate is positioned below a lower-most surface of the CMOS die and a lower-most surface of the MEMS die to define a height between the CMOS die and the PCB,
   further wherein the plurality of stud bumps and the plurality of solder bumps are in direct contact.

12. The MEMS device, as recited in claim 11, further including an air gap disposed between the MEMS die and the PCB.

13. The MEMS device, as recited in claim 11, further including one or more additional solder bumps between the plurality of solder bumps and the CMOS die.

14. The MEMS device, as recited in claim 11, further including one or more additional stud bumps between the plurality of stud bumps and the PCB.

15. The MEMS device, as recited in claim 11, wherein the PCB is void for port openings.

16. The MEMS device, as recited in claim 11, wherein the plurality of stud bumps is made from one of gold, copper and palladium.

17. The MEMS device, as recited in claim 11, wherein the plurality of solder bumps is made from one of: eutectic solder, tin, SAC305 and SAC405, wherein SAC305 comprises 96.5% tin, 3% silver, and 0.5% copper and SAC405 comprises 95.5% tin, 4% silver, and 0.5% copper.

18. The MEMS device, as recited in claim 11, further including an underfill formed between the CMOS die and the PCB.

19. The MEMS device, as recited in claim 17, wherein a space disposed between the MEMS die and the PCB is void of the underfill.

20. The MEMS device, as recited in claim 11, wherein the stud bumps are positioned on at least one side of the MEMS die and separated from the MEMS die by a polymer.

* * * * *